(12) United States Patent
Midha et al.

(10) Patent No.: US 11,563,436 B2
(45) Date of Patent: Jan. 24, 2023

(54) HIGH PERFORMANCE PHASE LOCKED LOOP FOR MILLIMETER WAVE APPLICATIONS

(71) Applicant: STMicroelectronics International N.V., Geneva (CH)

(72) Inventors: Gagan Midha, Panipat (IN); Kallol Chatterjee, Kolkata (IN); Anand Kumar, Noida (IN); Ankit Gupta, Delhi (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/863,708

(22) Filed: Jul. 13, 2022

(65) Prior Publication Data

US 2022/0352896 A1  Nov. 3, 2022

Related U.S. Application Data (63) Continuation of application No. 17/521,210, filed on Nov. 8, 2021, now Pat. No. 11,431,342.

(60) Provisional application No. 63/130,440, filed on Dec. 24, 2020.

(51) Int. Cl.
| | |
|---|---|
| *H03L 7/089* | (2006.01) |
| *H03L 7/197* | (2006.01) |
| *H03L 7/093* | (2006.01) |
| *H03L 7/099* | (2006.01) |

(52) U.S. Cl.
CPC ............ *H03L 7/0891* (2013.01); *H03L 7/093* (2013.01); *H03L 7/0992* (2013.01); *H03L 7/1976* (2013.01)

(58) Field of Classification Search
CPC ...... H03L 7/0891; H03L 7/093; H03L 7/1976
See application file for complete search history.

(56) References Cited

U.S. PATENT DOCUMENTS

| | | | |
|---|---|---|---|
| 11,115,036 B1 * | 9/2021 | Zhao | H03L 7/0995 |
| 11,228,318 B1 * | 1/2022 | Saric | G01S 13/343 |
| 2016/0277546 A1 * | 9/2016 | Unhold | H04B 1/69 |
| 2018/0097522 A1 * | 4/2018 | Chillara | H03L 7/0991 |
| 2021/0173070 A1 * | 6/2021 | Cherniak | G01S 7/0232 |

(Continued)

FOREIGN PATENT DOCUMENTS

| | | | | |
|---|---|---|---|---|
| EP | 1755224 A1 * | 2/2007 | | H03C 3/0925 |
| EP | 1755224 A1 | 2/2007 | | |
| EP | 3096160 B1 * | 2/2020 | | G01S 13/343 |

(Continued)

*Primary Examiner* — Adam D Houston
(74) *Attorney, Agent, or Firm* — Crowe & Dunlevy (57) ABSTRACT

A phase lock loop (PLL) includes an input comparison circuit configured to compare a reference signal to a divided feedback signal and generate at least one charge pump control signal based thereupon. A charge pump generates a charge pump output signal in response to the at least one charge pump control signal. A loop filter is coupled to receive and filter the charge pump output signal to produce an oscillator control signal. An oscillator generates an output signal in response to the oscillator control signal, with the output signal divided by a divisor using divider circuitry to produce the divided feedback signal. Divisor generation circuitry is configured to change the divisor over time so that a frequency of the divided feedback signal changes from a first frequency to a second frequency over time.

20 Claims, 6 Drawing Sheets

(56) References Cited

U.S. PATENT DOCUMENTS

2021/0364619 A1\* 11/2021 Landsberg ........... H04B 1/0483
2022/0043136 A1\* 2/2022 Finocchiaro ............ H03L 7/099

FOREIGN PATENT DOCUMENTS

| EP | 3096160 B1 | 2/2020 | |
|---|---|---|---|
| EP | 3800787 A1 \* | 4/2021 | ........... H03C 3/0925 |
| EP | 3800787 A1 | 4/2021 | |

\* cited by examiner

FIG. 12

HIGH PERFORMANCE PHASE LOCKED LOOP FOR MILLIMETER WAVE APPLICATIONS

RELATED APPLICATION

This is a continuation of U.S. patent application Ser. No. 17/521,210, filed Nov. 8, 2021, which claims priority to U.S. Provisional Application for Patent No. 63/130,440, filed Dec. 24, 2020, the contents of both of which are incorporated by reference in their entirety.

TECHNICAL FIELD

This disclosure is related to the field of phase locked loops and, in particular, to phase locked loops for generating chirps used in millimeter wave radar applications.

BACKGROUND

Radar systems, such as those used in automotive and industrial applications, operate by transmitting electromagnetic signals that are reflected by objects in their path. By detecting those electromagnetic signals that are reflected by the objects, a radar system can determine the range, velocity, and angle of those objects.

Millimeter wave (mmWave) radar is a special class of radar technology that uses short wavelength electromagnetic waves. A complete mmWave radar system includes transmit (TX) and receive (RX) radiofrequency (RF) components, clock generation components, and digital components such as analog-to-digital converters (ADCs), microcontrollers (MCUs) and digital signal processors (DSPs).

As stated, the fundamental concept in radar systems is the transmission of an electromagnetic signal that objects in its path reflect. In the signal used in mmWave radars, the frequency of the transmitted electromagnetic signal increases linearly with time. This type of signal is referred to as a "chirp".

Figure 1:
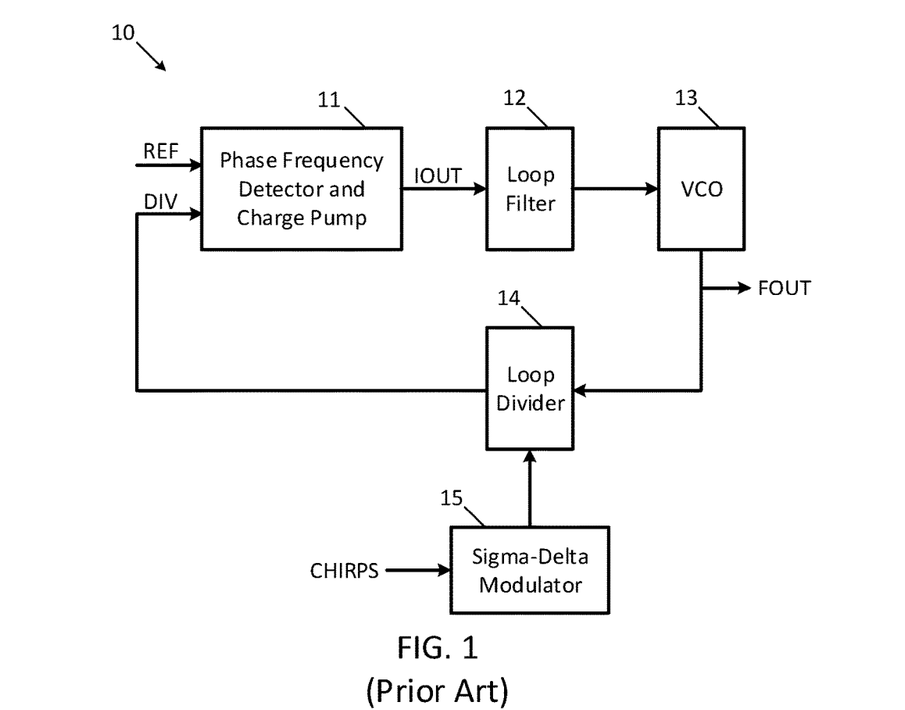
FIG. 1 is a block diagram of a known phase locked loop usable in a millimeter wave radar system.

A known phase locked loop (PLL) 10 that may be used to generate chirps for mmWave radars is shown in FIG. 1. The PLL includes a phase frequency detector and charge pump circuit 11 that receives a reference signal REF and a divided feedback signal DIV, compares the phase between the two, and generates a charge pump output signal IOUT signal based thereupon. The charge pump output signal IOUT, after filtering by a loop filter 12, is used to generate a control voltage to set the frequency of a voltage controlled oscillator (VCO) 13 that produces an output signal FOUT for the PLL. A loop divider 14 divides the output signal FOUT by a value that changes over time, said value being provided by a sigma-delta modulator 15, to produce the divided feedback signal DIV. The phase frequency detector and charge pump 11 adjusts the charge pump output signal IOUT so that, ultimately, the divided feedback signal DIV is equal in phase to the reference signal REF, implying that the divided feedback signal DIV is also equal in frequency to the reference signal REF. Since the divider value changes over time under control of the sigma-delta modulator 15, as explained, the charge pump output signal IOUT is likewise changed over time to keep the divided feedback signal DIV locked to the reference signal REF, as explained, with the result being that the output signal FOUT ramps in frequency. To perform a retrace (reset the frequency of the output signal FOUT to the original value to begin another chirp), the divider value is reset to its initial value.

Figure 2:
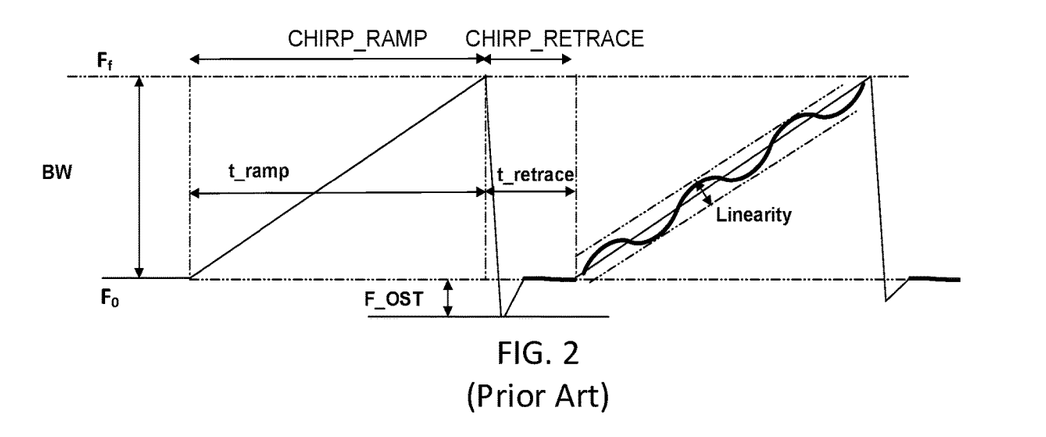
FIG. 2 is a graph showing chirps comprised of ramp periods and retrace periods, as used in a millimeter wave radar system.

Shown in FIG. 2 is a graph of a chirp's frequency over time. The chirps are defined by ramp periods CHIRP RAMP occurring over time period t_ramp and retrace periods CHIRP_RETRACE occurring over time period t_retrace. The ramp periods are characterized by a start frequency $F_0$ and an end frequency $F_f$, together defining a bandwidth BW of the chirp. The slope of the chirp during the ramp periods represents the rate of change of frequency. As can be seen, the retrace periods can be problematic, as the rapid drop in frequency from the end frequency $F_f$ back to the start frequency $F_0$ results in overshoot. The bandwidth of this overshoot is represented by F_OST in FIG. 2. Since overshoot increases the duration of the requisite retrace period (as the system needs to recover from the overshoot), it is desired to eliminate the overshoot so that the duration of the retrace period can be reduced, permitting an increased duty cycle or duty cycle frequency. In addition, it is desired for the chirp during the ramp periods to be sufficiently linear, and for charge pump noise, sigma-delta modulator noise, and reference signal noise to be filtered.

However, to increase the ramp slope, lower retrace time, and achieve good linearity, the bandwidth of the PLL 10 should be increased, while to filter out charge pump noise, sigma-delta modulator noise, and reference signal noise, the bandwidth of the PLL 10 should be decreased. These contradictory desires render known PLLs for generating chirps, such as the PLL 10, inadequate. As such, further development is needed.

SUMMARY

Disclosed herein is a locked loop which includes: an input comparison circuit configured to compare a reference signal to a divided feedback signal, and generate at least one charge pump control signal based thereupon; a charge pump configured to generate a charge pump output signal in response to the at least one charge pump control signal; a loop filter coupled to receive the charge pump output signal and to filter the charge pump output signal to produce an oscillator control signal; an oscillator configured to generate an output signal in response to the oscillator control signal; divider circuitry configured to divide the output signal by a divisor to produce the divided feedback signal; and divisor generation circuitry configured to change the divisor over time so that a frequency of the divided feedback signal changes from a first frequency to a second frequency over time.

The divisor generation circuitry may be further configured to, subsequent to the frequency of the divided feedback signal reaching the second frequency, change the divisor over time so that the frequency of the divided feedback signal returns from the second frequency to the first frequency over time.

The oscillator control signal may have a given value when the frequency of the divided feedback signal is at the first frequency. Oscillator control signal modification circuitry may be configured to, based upon the frequency of the divided feedback signal reaching the second frequency, cause the oscillator control signal to return to the given value.

The divisor generation circuitry may include: a digital to analog converter (DAC) configured to generate the oscillator control signal based upon received input codes; and a digital processing block configured to determine a given input code which, when applied to the DAC, results in the frequency of the output signal being equal to its value when the divided feedback signal is at the first frequency. The digital processing block may be configured to apply the given input code to the loop filter subsequent to the frequency of the divided feedback signal reaching the second frequency.

The divisor generation circuitry may include: a counter configured to generate a count indicative of the frequency of the output signal; a digital processing block configured to receive input from the counter and store the received count when the frequency of the output signal is equal to its value when the divided feedback signal is at the first frequency; and a digital to analog converter (DAC) configured generate the oscillator control signal based upon input received from the digital processing block and to apply the oscillator control signal to the loop filter subsequent to the frequency of the divided feedback signal reaching the second frequency.

The divisor generation circuitry may include: an analog to digital converter configured to digitize and store the oscillator control signal at which the frequency of the output signal is equal to a starting ramp frequency, the starting ramp frequency being the frequency of the output signal when the divided feedback signal is at the first frequency; and a digital to analog converter configured to convert the stored oscillator control signal back to analog and to apply the oscillator control signal to the loop filter subsequent to the frequency of the divided feedback signal reaching the second frequency.

The divider circuitry may include a fixed divider circuit receiving the output signal, dividing the output signal by a fixed divisor, and passing the output signal after division by the fixed divisor to a programmable divider. The programmable divider may divide the output signal by the divisor generated by the divisor generation circuitry.

The frequency of the divided feedback signal having the first frequency may result in a frequency of the output signal having a start ramp frequency and the frequency of the divided feedback signal having the second frequency results in the frequency of the output signal having an end ramp frequency.

The divisor generation circuitry may include: a multiplexer having an output providing input to a sigma-delta modulator that generates a control signal for the divider circuitry; a ramp generator generating a ramp signal and providing the ramp signal to the multiplexer; a resettable counter; a lookup table receiving a current count from the resettable counter and outputting a table entry based upon the current count; an interpolation circuit interpolating the table entry received from the lookup table; and a function circuit generating a sigma-delta modulator input that, if fed to the sigma-delta modulator as input, would result in the divisor changing such that the frequency of the output signal decays over time from the end ramp frequency to the start ramp frequency. The multiplexer may select the ramp signal for output during ramp periods during which the frequency of the output signal is increasing, and may select the sigma-delta modulator input for output during retrace periods during which the frequency of the output signal is decreasing.

A RF multiplier may receive the output signal and be configured to generate a RF signal based thereupon.

Also disclosed herein is a method, including: generating at least one charge pump control signal based upon a comparison between a reference signal and a divided feedback signal; generating a charge pump output signal in response to the at least one charge pump control signal; filtering the charge pump output signal to produce an oscillator control signal; generating an output signal in response to the oscillator control signal; dividing the output signal by a divisor to produce the divided feedback signal; and changing the divisor over time so that a frequency of the divided feedback signal changes from a first frequency to a second frequency over time.

Subsequent to the frequency of the divided feedback signal reaching the second frequency, the divisor may be changed over time so that the frequency of the divided feedback signal returns from the second frequency to the first frequency over time.

The oscillator control signal may have a given value when the frequency of the divided feedback signal is at the first frequency. The oscillator control signal may be caused to return to the given value based upon the frequency of the divided feedback signal reaching the second frequency.

Determining the oscillator control signal may include: generating a count representative of the frequency of the output signal; generating the oscillator control signal and applying the oscillator control signal to the filtering; wherein, in a configuration phase, different input codes are used until the frequency of the output signal is equal to the start ramp frequency, and an input code from among the different input codes which results in the frequency of the output signal being equal to the start ramp frequency is determined; and wherein the determined input code is used in generating the oscillator control signal.

The frequency of the divided feedback signal having the first frequency may result in a frequency of the output signal having a start ramp frequency and the frequency of the divided feedback signal having the second frequency may result in the frequency of the output signal having an end ramp frequency. The determining of the oscillator control signal may include: digitizing and storing the oscillator control signal at which the frequency of the output signal is equal to the start ramp frequency when the frequency of the output signal is equal to the start ramp frequency; and converting the stored oscillator control signal back to analog and applying the oscillator control signal at which the frequency of the output signal is equal to the start ramp frequency when the frequency of the output signal is equal to the end ramp frequency.

A frequency of the reference signal may be compared to a frequency of the divided feedback signal and generating the at least one charge pump control signal based upon the comparison.

The divisor may be changed by: generating a control signal for divider circuitry using a sigma-delta modulator; generating a ramp signal and providing the ramp signal to a multiplexer; receiving a current count from a resettable counter and outputting a lookup table entry from a lookup table based upon the current count; interpolating the table entry received from the lookup table; generating a sigma-delta modulator input that, if fed to the sigma-delta modulator as input, would result in the divisor changing such that the frequency of the output signal decays over time according a first order exponential function from the end ramp frequency to the start ramp frequency; and causing the multiplexer to select the ramp signal for output during ramp periods, and to select the sigma-delta modulator input for output during retrace periods.

Also disclosed herein is a radar device, including: a transmitter antenna; a synthesizer configured to generate a RF signal for transmission by the transmitter antenna; a receiver antenna configured to receive a reflected RF signal; a mixer configured to receive the RF signal generated by the synthesizer and the reflected RF signal, and to generate an intermediate frequency signal based thereupon; an analog to digital converter configured to digitize the intermediate frequency signal; and processing circuitry configured to determine a distance between the radar device and an external object off which the reflected RF signal reflected, based upon the intermediate frequency signal. The synthesizer may include a phase locked loop. The phase locked loop may include: an input comparison circuit configured to compare a reference signal to a divided feedback signal, and generate at least one charge pump control signal based thereupon; a charge pump configured to generate a charge pump output signal in response to the at least one charge pump control signal; a loop filter coupled to receive the charge pump output signal and to filter the charge pump output signal to produce an oscillator control signal; an oscillator configured to generate an output signal in response to the oscillator control signal; divider circuitry configured to divide the output signal by a divisor to produce the divided feedback signal; and divisor generation circuitry configured to change the divisor over time so that a frequency of the divided feedback signal changes from a first frequency to a second frequency over time.

The divisor generation circuitry may be further configured to, subsequent to the frequency of the divided feedback signal reaching the second frequency, change the divisor over time so that the frequency of the divided feedback signal returns from the second frequency to the first frequency over time.

The oscillator control signal may have a given value when the frequency of the divided feedback signal is at the first frequency. Oscillator control signal modification circuitry may be configured to, based upon the frequency of the divided feedback signal reaching the second frequency, cause the oscillator control signal to return to the given value.

Also disclosed herein is a method, including: changing a divisor of a loop divider of a phase locked loop (PLL) over time so that: during ramp periods, an output signal of the PLL has a frequency that ramps from a start ramp frequency to an end ramp frequency; and during retrace periods, the frequency of the output signal of the PLL returns to the start ramp frequency.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 3:
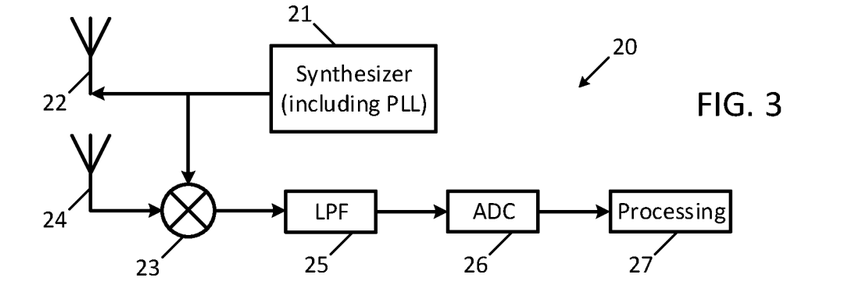
FIG. 3 is a block diagram of a millimeter wave radar system disclosed herein.

With initial reference to FIG. 3, a mmWave radar system 20 is now described. The mmWave radar system 20 includes a synthesizer 21 including a phase locked loop (PLL) to generate mmWave chirps to be transmitted by the transmitter antenna 22. Note that the mmWave chirps are also passed to the mixer 23. The chirps are emitted outwardly from the transmitter antenna 22 in a path of travel of the device (e.g., a vehicle or piece of moving industrial equipment) incorporating the mmWave radar system, and reflect off objects in the path of travel of the device. The reflections are received by the receiver antenna 24, and the resulting signal is passed to the mixer 23, which mixes the outgoing mmWave chirps and the incoming reflections to form an intermediate frequency (IF) signal. The IF signal is filtered by a low pass filter (LPF) 25, and digitized by an analog to digital converter (ADC) 26.

As understood by those of skill in the art, from the IF signal and known properties of the transmit chirp, the distance to the object from which the chirp reflected can be mathematically calculated by a processing circuit 27 receiving the digitized IF signal. In some instances, through analysis of two separate IF signal pulses, the velocity of that object can be calculated as well. If multiple receive antennas are used, the angle of the object to the device incorporating the mmWave radar system 20 can be determined.

Particularly in the case of vehicular and industrial applications of the mmWave radar system 20, it is desired to combine the effects of low PLL bandwidth in generating the chirps (which has the effect of filtering out charge pump noise, sigma-delta modulator noise, and reference signal noise) with the effects of high PLL bandwidth (which has the effect of providing for good linearity, high ramp slope, and low retrace time). In order to achieve these effects from seemingly contradictory design desires, a new PLL 30 has been designed for use in the synthesizer 21, and such PLL 30 will now be described with reference to FIG. 4.

Figure 4:
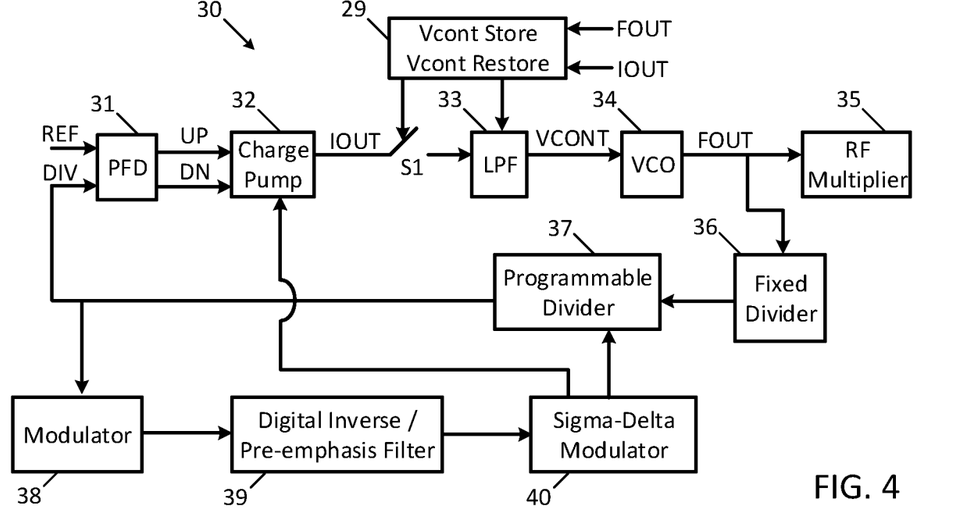
FIG. 4 is a block diagram of a first embodiment of a phase locked loop disclosed herein usable with the millimeter wave radar system of FIG. 3.

The PLL 30 includes a phase frequency detector (PFD) 31 receiving a reference signal REF and a divided feedback signal DIV, and generating control signals UP, DN for charge pump 32 based up a comparison between the phase of REF and DIV. The charge pump 32 generates a charge pump output signal IOUT based upon the control signals UP, DN, which is then selectively passed through a low pass filter (LPF) 33 by a switch S1 to produce a control signal VCONT for a voltage controlled oscillator (VCO) 34.

The VCO 34 generates an output signal FOUT based upon the control signal VCONT. A radiofrequency (RF) multiplier

35 generates the chirps to be transmitted by the transmitter antenna 22 based upon the output signal FOUT.

The output signal FOUT is also passed through a fixed divider 36 and a programmable divider 37 to produce the divided feedback signal DIV. Note that a modulator 38 also receives the divided feedback signal DIV, and passes its output through a digital inverse/pre-emphasis filter 39 to provide input to a sigma-delta modulator 40. The sigma-delta modulator 40 controls the divisor used by the programmable divider 37, and may provide a control signal to the charge pump 32 to help reduce quantization noise. Further details on the cancellation of sigma-delta modulation quantization noise may be found in IEEE Journal of Solid-State Circuits, Vol. 39, No. 9, September 2004, by Temporiti et al., entitled "A 700-kHz Bandwidth Sigma-Delta Fractional Synthesizer With Spurs Compensation and Linearization Techniques for WCDMA Applications", the contents of which are incorporated by reference in their entirety.

The charge pump output signal IOUT, and therefore the control signal VCONT, are aimed to set the frequency of the output signal FOUT such that the phase (and therefore the frequency) of the divided feedback signal DIV is equal to the frequency of the reference signal REF. The digital inverse/pre-emphasis filter 39 adds the appropriate pre-emphasis to the output from the modulator 38 to result in the sigma-delta modulator 40 ramping the divisor of the programmable divider 37, in turn forcing the PFD 31 to cause an increase in the frequency of the output signal FOUT, thereby generating the ramp of the frequency of the chirp during the ramp period. This allows the bandwidth of the chirp to remain low to minimize noise.

In order to determine the transfer function of the digital inverse/pre-emphasis filter 39, a model of the PLL 30 is generated in the Laplace domain, and then transformed to the Z domain. From the model of the PLL 30 in the Z domain, the transfer function of the digital inverse/pre-emphasis filter 39 can be appropriately determined as understood by those of skill in the art.

Note the presence of the circuit 29, which serves to store the value of the VCO control signal VCONT at the start of the ramp period (e.g., saves the value of VCONT that results in the frequency of FOUT being generated as $F_0$). At the end of the ramp period (at the beginning of the retrace period of the chirp), the loop is opened by opening switch S1 (which may be performed by circuit 29), and the circuit 29 restores the stored value of VCONT (e.g., by forcing the saved value of VCONT on the output of the LPF 33), resulting in the rapid fall of the ramp back to $F_0$. The loop is then closed by closing switch S1, and the output signal FOUT is allowed to settle before beginning the next ramp period. This technique provides for quick retrace without overshoot, helping eliminate the possibility of cycle slipping due to the large negative slope of the frequency of FOUT during retrace, and helps improve linearity of the chirp during the ramp period.

Figure 5:
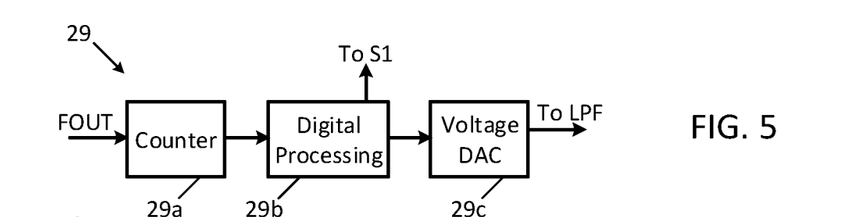
FIG. 5 is a block diagram of a first embodiment of the VCO control signal store/restore circuit of the phase locked loop of FIG. 4.

Shown in FIG. 5 is one possible configuration for the circuit 29. The circuit 29 can include a counter 29a, a digital processing block 29b (e.g., a microcontroller or microprocessor utilizing a lookup table), and a voltage digital to analog converter (DAC) 29c. During an initial configuration phase with the switch S1 open, the counter 29a measures the frequency of FOUT while the digital processing block 29b, through the voltage DAC 29c, forces different voltages through the LPF 33 to produce different values of VCONT. Through this, the digital processing block 29b forms a lookup table of DAC codes, with each DAC code corresponding to the frequency of FOUT that results from application of that DAC code to the voltage DAC 29c (therefore resulting in a different value of VCONT, and thus different frequency of FOUT, for each DAC code). Then the switch S1 is closed in order for the counter 29a to measure the frequency of FOUT being generated as $F_0$ at the beginning of the ramp period. From this, the digital processing block 29b now knows which DAC code to force on the voltage DAC 29c at the end of the ramp period (beginning of the retrace period). In addition, the counter 29a may measure the frequency of FOUT generated as the frequency $F_f$.

To utilize this configuration of the circuit 29, once the lookup table has been built in the configuration phase and the DAC code to use for retrace has been determined, the mmWave radar system 20 and PLL 30 are activated and the switch S1 is closed.

At the end of the ramp period (at the beginning of the retrace period of the chirp), which may be determined, for example, by the frequency of FOUT being measured by the counter 29a and reaching the frequency $F_f$ determined during the calibration phase, the loop is opened by opening switch S1 (under control of the circuit 29, in particular the digital processing block 29b), and the digital processing block 29b forces the previously determined retrace DAC code on the input of the voltage DAC 29c. This voltage DAC 29c output is passed through the LPF 33 to generate the value of VCONT for the VCO 34 to use to begin retrace, resulting in the rapid fall of the chirp back to $F_0$. The loop is then closed by closing switch S1 (under control of the circuit 29), and the output signal FOUT is allowed to settle before beginning the next ramp period.

Figure 6:
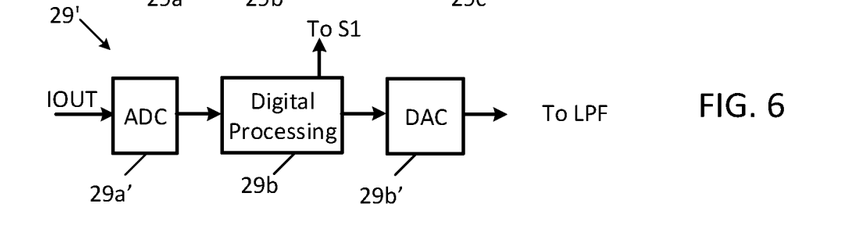
FIG. 6 is a block diagram of a second embodiment of the VCO control signal store/restore circuit of the phase locked loop of FIG. 4.

Shown in FIG. 6 is another possible configuration for the circuit 29'. The circuit 29' can include an analog to digital converter (ADC) 29a' that digitizes the charge pump output IOUT (that results in the frequency of FOUT being $F_0$) at the beginning of the ramp period, and then at the end of the ramp period (once switch S1 has been opened), outputs that digital value, optionally through digital processing circuitry 29b that controls switch S1 as described above, to a digital to analog converter (DAC) 20b' that converts that digital value back to an analog current and forces that current on the input of the LPF 33 to generate the value of VCONT for the VCO 34 to use to begin retrace, resulting in the rapid fall of the chirp back to $F_0$. The loop is then closed by closing switch S1, and the output signal FOUT is allowed to settle before beginning the next ramp period. Note that with this embodiment, as opposed to the embodiment of FIG. 5, the value of $F_0$ can be re-determined on a cycle to cycle basis, or on a periodic basis, thereby helping provide for the precise tracking of the chirps over temperature.

Figure 7:
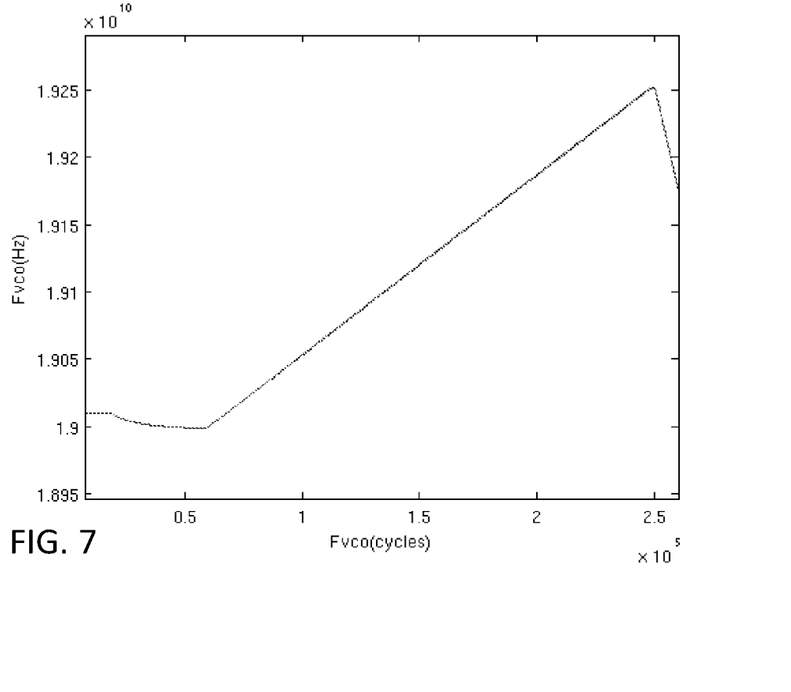
FIG. 7 is a graph of a chirp generated using the millimeter wave radar system of FIG. 3 when utilizing the phase locked loop of FIG. 4.

The performance provided by the PLL 30 can be seen in FIG. 7, where it achieved a retrace time of 2.75 μs, a ramp period of 10 μs, linearity within ±0.25%, overshoot of less than 1 Mhz, and a bandwidth of about 200 KHz. This performance is unachievable with prior art designs, providing the mmWave system 20 with unmatched performance.

Figure 8:
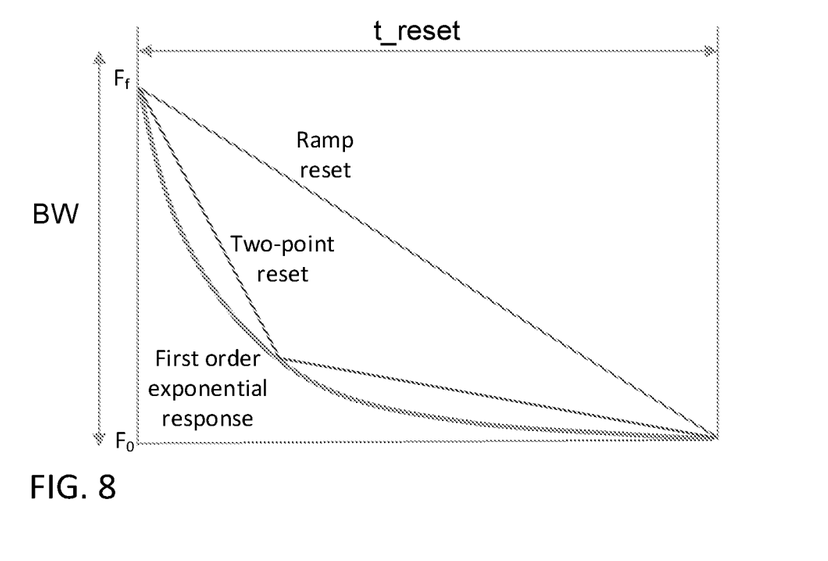
FIG. 8 is an enlarged graph of a retrace period of a chirp generated using the millimeter wave radar system of FIG. 3 with different retrace strategies.

In some cases, it may be desirable to trade a small amount of the precise and robust performance of the PLL 30 for a less expensive to implement PLL that consumes less area but still achieves sufficiently good performance for use in the mmWave system 20. With reference to FIG. 8, note that during the retrace period (the time interval of which is shown as t reset), the frequency of the chirp falls from its high value $F_f$ to its low value $F_0$. If, as done with prior art systems, the divisor is simply reset to its initial value, the resulting downward ramp of the frequency of the chirp, shown as "Ramp reset", would result in an undesirable amount of overshoot. Another idea would be to change the slope of the downward ramp of the frequency of the chirp during the retrace period, shown as "Two-point reset". While this does reduce overshoot, the amount of overshoot is still undesirable. It has been found, and will now be described herein, that when the slope of the downward ramp of the frequency of the chirp during the retrace period is reduced in a first order exponential manner, overshoot is eliminated.

A phase locked loop (PLL) 30' incorporating this functionality is now described with reference to FIG. 9. The PLL 30' includes a phase frequency detector and charge pump 51 that receives a reference signal REF and a divided feedback signal DIV, compares the phase between the two, and generates a charge pump output signal IOUT signal based thereupon. The charge pump output signal IOUT, after filtering by a loop filter 52, is used to set the frequency of a voltage controlled oscillator (VCO) 53 that produces an output signal FOUT for the PLL. The output signal FOUT is fed to an RF multiplier 54, which in turn generates the RF signal for transmission by the transmitter antenna 22. A loop divider 55 divides the output signal FOUT by a value that changes over time, said value being provided by a sigma-delta modulator 62, to produce the divided feedback signal DIV. The phase frequency detector and charge pump 51 adjusts the charge pump output signal IOUT so that, ultimately, the divided feedback signal DIV is equal in phase to the reference signal REF, implying that the divided feedback signal DIV is also equal in frequency to the reference signal REF. Since the divider value changes over time under control of the sigma-delta modulator 62, as explained, the charge pump output signal IOUT is likewise changed over time to keep the divided feedback signal DIV locked to the reference signal REF, as explained, with the result being that the output signal FOUT ramps.

The generation of the input to the sigma-delta modulator 62 is now described. During ramp periods t_ramp, the output of a ramp generator 60 is selected by multiplexer 61 and provided to the input of the sigma-delta modulator 62, so as to increase the divisor of the sigma-delta modulator 62 over time to achieve the desired ramp of the frequency of the chirp over the ram period.

During retrace periods t_retrace, a reset counter 56 (meaning that it counts from a start value to a desired end value, and is reset back to the start value once it had reached the end value) provides output to a lookup table 57. The lookup table may in some instances have a low precision portion (for example, the first ¾th of the entries may be 6-bit) and a high precision portion (for example, the final ¼th of entries may be 10-bit). Depending on the count value received from the reset counter 56, the lookup table 57 outputs the value stored at the appropriate table entry to an interpolation circuit 58, which passes the results, after interpolation, to the function block 59, which implements the function $N_L + BW \cdot Fd(x)$, where $N_L$ is the lowest frequency of the ramp, $BW = F_f - F_0$ ($F_f$ being the highest frequency of the ramp), and $Fd(x)$ is the output of the lookup table 57 after interpolation by the interpolation circuit 58. The output of the function block 59 (mathematically, $Fd(x)$) is selected by the multiplexer 61 during retrace, and passed to the sigma-delta modulator 62 as input to implement the slope of the chirp having a first order exponential decay.

In some instances, the processing of the interpolation block 58 effectively "holds" each sample for a period of time, increasing the period of time for which that sample influences the output of the sigma-delta modulator 62. This can increase the retrace time for applications where that is desired.

The multiplexer 61 is controlled by a control block 66, which selects the output of the ramp generator 60 or the output of the function block 59 based upon the outputs of each. The reset counter is reset by the control block 66, also based upon the outputs of the ramp generator 60 and the output of the function block 59.

Figure 10:
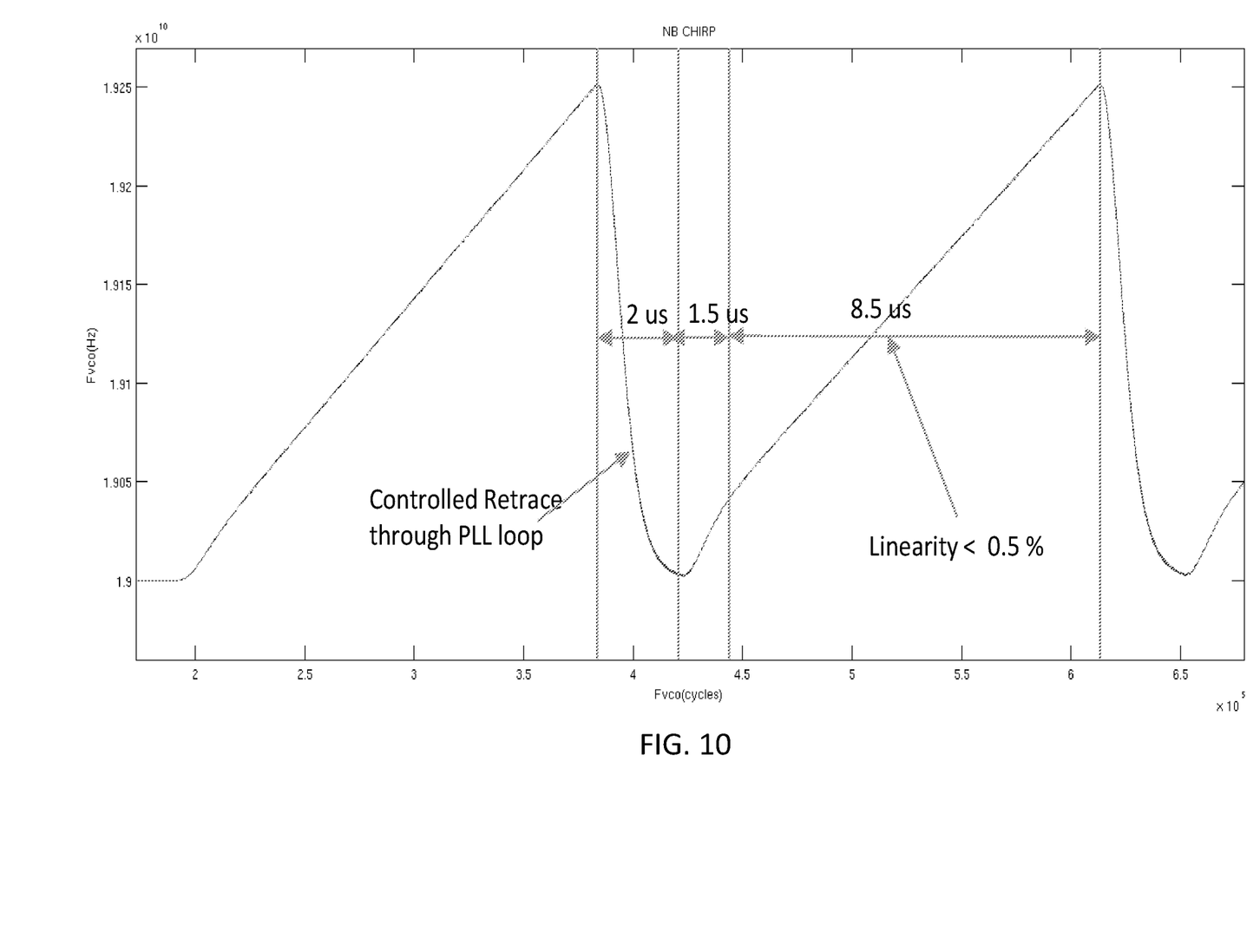
FIG. 10 is a graph of two chirps generated using the millimeter wave radar system of FIG. 3 when using the phase locked loop of FIG. 9.

The output signal FOUT can be seen in FIG. 10. Notice the controlled exponential decay of the frequency of the output signal FOUT during retrace, without much overshoot. Note that high degree of linearity during the ramp periods. The retrace time in this embodiment is 3.5 µs, with less than 0.25 MHz overshoot.

Note that although both the embodiments of FIG. 3 and FIG. 9 have been described with reference to the ramping of the chirp being from a low frequency to a high frequency, and the retrace of the chirp being from a high frequency to a low frequency, either embodiment can clearly be arranged to perform the opposite, with the ramping of the chirp being from a high frequency to a low frequency and the retrace of the chirp being from a low frequency to a high frequency.

Although the above embodiments 30 and 30' have been described as being arranged as phase locked loops, it should be appreciated that both embodiments 30 and 30' may instead be arranged as frequency locked loops.

Figure 11:
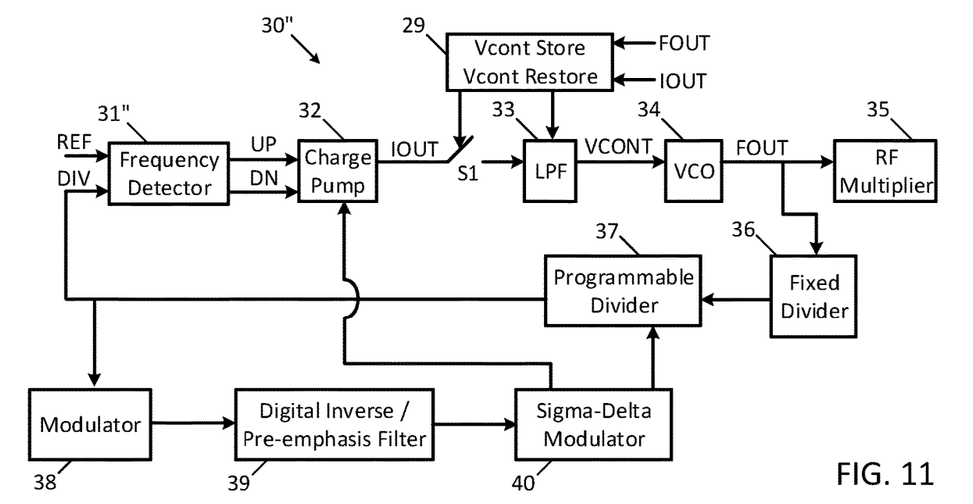
FIG. 11 is a block diagram of a first embodiment of a frequency locked loop disclosed herein.

In the case of the frequency locked loop (FLL) 30'' shown in FIG. 11, it has the same design and operation as the PLL 30 of FIG. 4, except the phase frequency detector 31 has been replaced with a frequency detector 31''. Instead of generating the control signals UP and DN based upon whether the phase of the reference signal REF and the divided feedback signal DIV match, the frequency detector 31'' generates the control signals UP and DN based upon whether the frequency of the reference signal REF and the divided feedback signal DIV match. Those skilled in the art will appreciate that if two signals match in phase, they match in frequency, but if two signals match in frequency, they do not necessarily match in phase.

Figure 9:
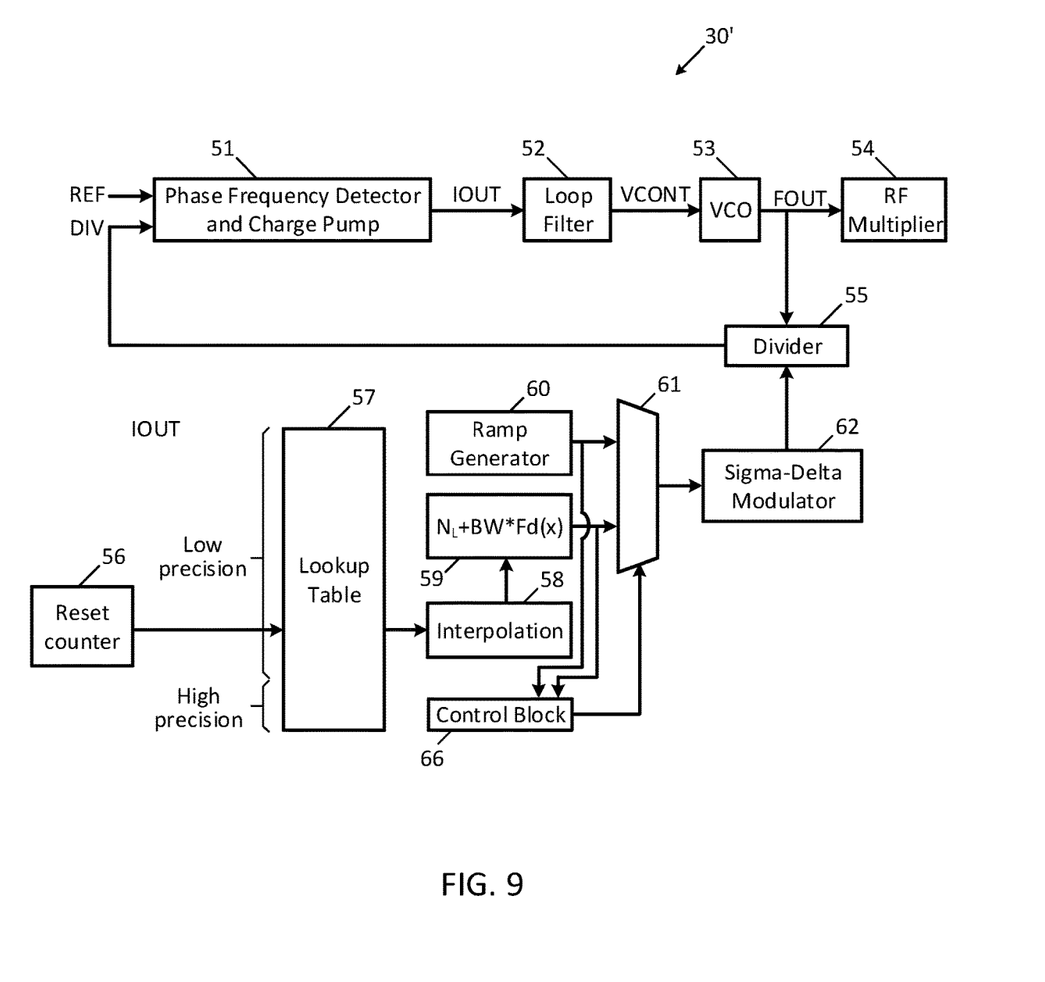
FIG. 9 is a block diagram of a second embodiment of a phase locked loop disclosed herein usable with the millimeter wave radar system of FIG. 3.
Figure 12:
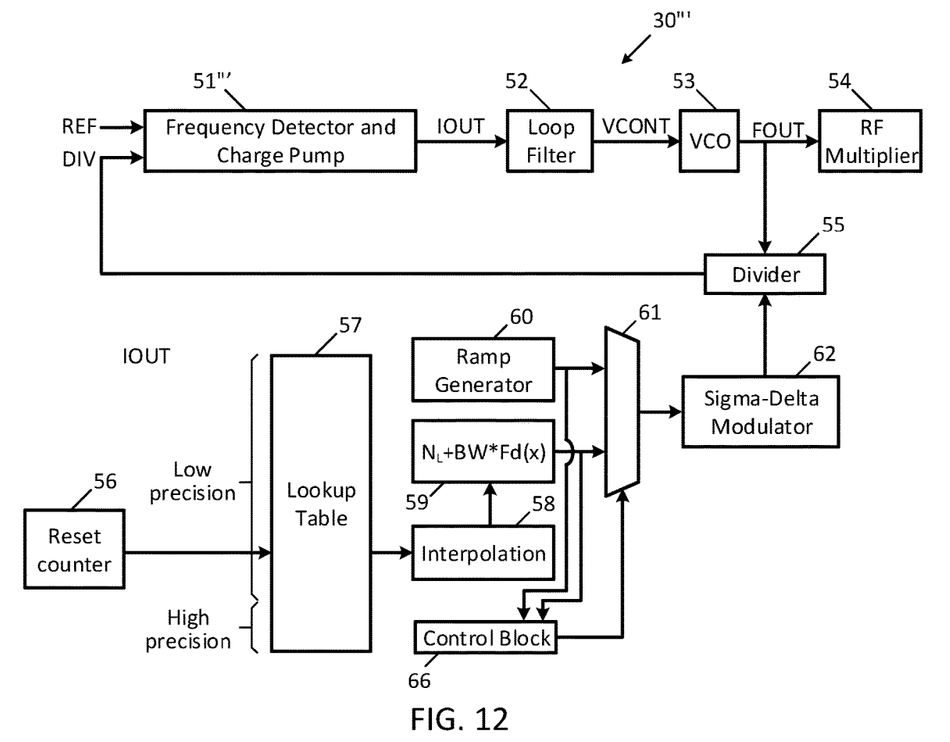
FIG. 12 is a block diagram of a second embodiment of a frequency locked loop disclosed herein.

In the case of the FLL 30''' shown in FIG. 12, it has the same design and operation as the PLL 30' of FIG. 9, except the phase frequency detector and charge pump 51 has been replaced with a frequency detector and charge pump 51'''. Instead of generating the charge pump output signal IOUT based upon whether the phase of the reference signal REF and the divided feedback signal DIV match, the frequency detector and charge pump 51''' generates the charge pump output signal based upon whether the frequency of the reference signal REF and the divided feedback signal DIV match.

The above-mentioned frequency locked loop embodiments may be useful in some applications in which phase locked loops are not desired, or in some applications where frequency lock alone is sufficient.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:
1. A locked loop, comprising:
an input comparison circuit configured to compare a reference signal to a divided feedback signal, and generate at least one charge pump control signal based thereupon;

a charge pump configured to generate a charge pump output signal in response to the at least one charge pump control signal;

a loop filter coupled to receive the charge pump output signal and to filter the charge pump output signal to produce an oscillator control signal;

an oscillator configured to generate an output signal in response to the oscillator control signal;

divider circuitry configured to divide the output signal by a divisor to produce the divided feedback signal; and divisor generation circuitry configured to change the divisor over time so that a frequency of the divided feedback signal changes from a first frequency to a second frequency over time.

2. The locked loop of claim 1, wherein the divisor generation circuitry is further configured to, subsequent to the frequency of the divided feedback signal reaching the second frequency, further change the divisor over time so that the frequency of the divided feedback signal returns from the second frequency to the first frequency over time.

3. The locked loop of claim 1, wherein the oscillator control signal has a given value when the frequency of the divided feedback signal is at the first frequency; further comprising oscillator control signal modification circuitry configured to cause the oscillator control signal to return to the given value in response to the frequency of the divided feedback signal reaching the second frequency.

4. The locked loop of claim 1,
wherein the divisor generation circuitry comprises:
a digital to analog converter (DAC) configured to generate the oscillator control signal based upon received input codes; and
a digital processing block configured to determine a given input code which, when applied to the DAC, results in the frequency of the output signal being equal to its value when the divided feedback signal is at the first frequency; and
wherein the digital processing block is configured to apply the given input code to the loop filter subsequent to the frequency of the divided feedback signal reaching the second frequency.

5. The locked loop of claim 1, wherein the divisor generation circuitry comprises:
a counter configured to generate a count indicative of the frequency of the output signal;
a digital processing block configured to receive the count as input from the counter and store the received count when the frequency of the output signal is equal to its value when the divided feedback signal is at the first frequency; and
a digital to analog converter (DAC) configured to generate the oscillator control signal based upon input received from the digital processing block and apply the oscillator control signal to the loop filter subsequent to the frequency of the divided feedback signal reaching the second frequency.

6. The locked loop of claim 1, wherein the divisor generation circuitry comprises:
an analog to digital converter configured to digitize and store the oscillator control signal at which the frequency of the output signal is equal to a starting ramp frequency, the starting ramp frequency being the frequency of the output signal when the divided feedback signal is at the first frequency; and
a digital to analog converter configured to convert the stored oscillator control signal back to analog and to apply the oscillator control signal to the loop filter subsequent to the frequency of the divided feedback signal reaching the second frequency.

7. The locked loop of claim 1, wherein the divider circuitry comprises a fixed divider circuit configured to receive the output signal, divide the output signal by a fixed divisor, and pass the output signal after division by the fixed divisor to a programmable divider; and wherein the programmable divider is configured to divide the output signal by the divisor generated by the divisor generation circuitry.

8. The locked loop of claim 1,
wherein the frequency of the divided feedback signal having the first frequency results in a frequency of the output signal having a start ramp frequency and the frequency of the divided feedback signal having the second frequency results in the frequency of the output signal having an end ramp frequency; and
wherein the divisor generation circuitry comprises:
a multiplexer having an output providing input to a sigma-delta modulator that generates a control signal for the divider circuitry;
a ramp generator generating a ramp signal and providing the ramp signal to the multiplexer;
a resettable counter;
a lookup table receiving a current count from the resettable counter and outputting a table entry based upon the current count;
an interpolation circuit interpolating the lookup table entry received from the lookup table; and
a function circuit generating a sigma-delta modulator input that, if fed to the sigma-delta modulator as input, would result in the divisor changing such that the frequency of the output signal decays over time from the end ramp frequency to the start ramp frequency;
wherein the multiplexer selects the ramp signal for output during ramp periods during which the frequency of the output signal is increasing, and selects the sigma-delta modulator input for output during retrace periods during which the frequency of the output signal is decreasing.

9. The locked loop of claim 1, further comprising a RF multiplier receiving the output signal and configured to generate a RF signal based thereupon.

10. A method, comprising:
generating at least one charge pump control signal based upon a comparison between a reference signal and a divided feedback signal;
generating a charge pump output signal in response to the at least one charge pump control signal;
filtering the charge pump output signal to produce an oscillator control signal;
generating an output signal in response to the oscillator control signal;
dividing the output signal by a divisor to produce the divided feedback signal; and
changing the divisor over time so that a frequency of the divided feedback signal changes from a first frequency to a second frequency over time.

11. The method of claim 10, further comprising, subsequent to the frequency of the divided feedback signal reaching the second frequency, changing the divisor over time so that the frequency of the divided feedback signal returns from the second frequency to the first frequency over time.

12. The method of claim 10, wherein the oscillator control signal has a given value when the frequency of the divided feedback signal is at the first frequency; and further comprising causing the oscillator control signal to return to the given value in response to the frequency of the divided feedback signal reaching the second frequency.

13. The method of claim 10,
wherein the frequency of the divided feedback signal having the first frequency results in a frequency of the output signal having a start ramp frequency and the frequency of the divided feedback signal having the second frequency results in the frequency of the output signal having an end ramp frequency; and
wherein the determining of the oscillator control signal comprises:
generating a count representative of the frequency of the output signal;
generating the oscillator control signal and applying the oscillator control signal to the filtering;
wherein, in a configuration phase, different input codes are used until the frequency of the output signal is equal to the start ramp frequency, and an input code from among the different input codes which results in the frequency of the output signal being equal to the start ramp frequency is determined; and
wherein the determined input code is used in generating the oscillator control signal.

14. The method of claim 10,
wherein the frequency of the divided feedback signal having the first frequency results in a frequency of the output signal having a start ramp frequency and the frequency of the divided feedback signal having the second frequency results in the frequency of the output signal having an end ramp frequency; and
wherein the determining of the oscillator control signal comprises:
digitizing and storing the oscillator control signal at which the frequency of the output signal is equal to the start ramp frequency when the frequency of the output signal is equal to the start ramp frequency; and
converting the stored oscillator control signal back to analog and applying the oscillator control signal at which the frequency of the output signal is equal to the start ramp frequency when the frequency of the output signal is equal to the end ramp frequency.

15. The method of claim 10, further comprising comparing a frequency of the reference signal to a frequency of the divided feedback signal and generating the at least one charge pump control signal based upon the comparison.

16. The method of claim 10,
wherein the frequency of the divided feedback signal having the first frequency results in a frequency of the output signal having a start ramp frequency and the frequency of the divided feedback signal having the second frequency results in the frequency of the output signal having an end ramp frequency; and
wherein the divisor is changed by:
generating a control signal for divider circuitry using a sigma-delta modulator;
generating a ramp signal and providing the ramp signal to a multiplexer;
receiving a current count from a resettable counter and outputting a lookup table entry from a lookup table based upon the current count;
interpolating the lookup table entry received from the lookup table;
generating a sigma-delta modulator input that, if fed to the sigma-delta modulator as input, would result in the divisor changing such that the frequency of the output signal decays over time according a first order exponential function from the end ramp frequency to the start ramp frequency; and
causing the multiplexer to select the ramp signal for output during ramp periods, and to select the sigma-delta modulator input for output during retrace periods.

17. A radar device, comprising:
a transmitter antenna;
a synthesizer configured to generate a RF signal for transmission by the transmitter antenna;
a receiver antenna configured to receive a reflected RF signal;
a mixer configured to receive the RF signal generated by the synthesizer and the reflected RF signal, and to generate an intermediate frequency signal based thereupon;
an analog to digital converter configured to digitize the intermediate frequency signal; and
processing circuitry configured to determine a distance between the radar device and an external object off which the reflected RF signal reflected, based upon the intermediate frequency signal;
wherein the synthesizer comprises:
a phase locked loop, comprising:
an input comparison circuit configured to compare a reference signal to a divided feedback signal, and generate at least one charge pump control signal based thereupon;
a charge pump configured to generate a charge pump output signal in response to the at least one charge pump control signal;
a loop filter coupled to receive the charge pump output signal and to filter the charge pump output signal to produce an oscillator control signal;
an oscillator configured to generate an output signal in response to the oscillator control signal;
divider circuitry configured to divide the output signal by a divisor to produce the divided feedback signal; and
divisor generation circuitry configured to change the divisor over time so that a frequency of the divided feedback signal changes from a first frequency to a second frequency over time.

18. The radar device of claim 17, wherein the divisor generation circuitry is further configured to, subsequent to the frequency of the divided feedback signal reaching the second frequency, change the divisor over time so that the frequency of the divided feedback signal returns from the second frequency to the first frequency over time.

19. The radar device of claim 17, wherein the oscillator control signal has a given value when the frequency of the divided feedback signal is at the first frequency; further comprising oscillator control signal modification circuitry configured to cause the oscillator control signal to return to the given value in response to the frequency of the divided feedback signal reaching the second frequency.

20. A method, comprising:
changing a divisor of a loop divider of a phase locked loop (PLL) over time so that:
during ramp periods, an output signal of the PLL has a frequency that ramps from a start ramp frequency to an end ramp frequency; and
during retrace periods, the frequency of the output signal of the PLL returns to the start ramp frequency.

* * * * *